US010096678B2

(12) United States Patent
Breen et al.

(10) Patent No.: US 10,096,678 B2
(45) Date of Patent: Oct. 9, 2018

(54) METHODS FOR COATING SEMICONDUCTOR NANOCRYSTALS

(71) Applicant: SAMSUNG ELECTRONICS CO., LTD, Suwon-si (KR)

(72) Inventors: Craig Breen, Somerville, MA (US); Wenhao Liu, Billerica, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/284,228

(22) Filed: May 21, 2014

(65) Prior Publication Data
US 2015/0014629 A1     Jan. 15, 2015

Related U.S. Application Data

(63) Continuation of application No. PCT/US2012/066137, filed on Nov. 20, 2012.

(60) Provisional application No. 61/562,457, filed on Nov. 22, 2011.

(51) Int. Cl.
*H01L 29/15* (2006.01)
*H01L 21/02* (2006.01)
*H01L 29/225* (2006.01)
*C09K 11/02* (2006.01)
*C09K 11/88* (2006.01)
*B82Y 20/00* (2011.01)
*B82Y 40/00* (2011.01)

(52) U.S. Cl.
CPC ........... *H01L 29/151* (2013.01); *C09K 11/02* (2013.01); *C09K 11/883* (2013.01); *H01L 21/0256* (2013.01); *H01L 21/02409* (2013.01); *H01L 21/02521* (2013.01); *H01L 21/02557* (2013.01); *H01L 21/02601* (2013.01); *H01L 21/02628* (2013.01); *H01L 29/225* (2013.01); *B82Y 20/00* (2013.01); *B82Y 40/00* (2013.01); *Y10S 977/774* (2013.01); *Y10S 977/892* (2013.01); *Y10S 977/95* (2013.01)

(58) Field of Classification Search
CPC ......... H01L 21/02409; H01L 21/02557; H01L 21/0256; H01L 21/02601; C09K 11/565; C09K 11/883
See application file for complete search history.

(56) References Cited

U.S. PATENT DOCUMENTS

| | | | |
|---|---|---|---|
| 37,600,000 | | 9/1973 | Curry |
| 6,322,901 | B1 | 11/2001 | Bawendi et al. |
| 6,607,829 | B1 | 8/2003 | Bawendi et al. |
| 6,815,064 | B2 | 11/2004 | Treadway et al. |
| 7,229,497 | B2 | 6/2007 | Stott et al. |
| 7,267,810 | B2 | 9/2007 | Yu et al. |
| 7,476,599 | B2 | 1/2009 | Wang et al. |
| 7,482,059 | B2 | 1/2009 | Peng et al. |
| 7,557,028 | B1 | 7/2009 | Scher et al. |
| 7,615,800 | B2 | 11/2009 | Kahen |
| 7,767,260 | B2 | 8/2010 | Peng et al. |
| 7,824,731 | B2 | 11/2010 | Ying et al. |
| 7,919,012 | B2 | 4/2011 | Peng et al. |
| 7,935,419 | B1 * | 5/2011 | Hollingsworth ....... B82Y 10/00 428/402 |
| 8,354,785 | B2 | 1/2013 | Clough et al. |
| 8,377,333 | B2 | 2/2013 | Ramprasad |
| 8,404,154 | B2 | 3/2013 | Breen et al. |
| 8,691,114 | B2 | 4/2014 | Ramprasad |
| 8,718,437 | B2 | 5/2014 | Coe-Sullivan et al. |
| 8,845,927 | B2 | 9/2014 | Breen et al. |
| 8,876,272 | B2 | 11/2014 | Linton et al. |
| 8,906,265 | B2 | 12/2014 | Breen et al. |
| 8,980,133 | B2 | 3/2015 | Ramprasad |
| 8,981,339 | B2 | 3/2015 | Linton et al. |
| 9,054,329 | B2 | 6/2015 | Coe-Sullivan et al. |
| 9,136,428 | B2 | 9/2015 | Clough et al. |
| 9,139,435 | B2 | 9/2015 | Breen et al. |
| 2002/0106849 | A1 | 8/2002 | Moore |
| 2003/0145779 | A1 | 8/2003 | Alivisatos et al. |
| 2003/0227116 | A1 | 12/2003 | Halik et al. |
| 2004/0178390 | A1 | 9/2004 | Whiteford et al. |
| 2005/0129947 | A1 | 6/2005 | Peng et al. |
| 2006/0110279 | A1 | 5/2006 | Hau et al. |
| 2007/0128439 | A1 | 6/2007 | Kim et al. |
| 2007/0201056 | A1 | 8/2007 | Cok et al. |
| 2007/0295266 | A1 | 12/2007 | Lee et al. |
| 2008/0012031 | A1 | 1/2008 | Jang et al. |
| 2008/0084706 | A1 | 4/2008 | Roshan et al. |
| 2008/0118755 | A1 | 5/2008 | Whiteford et al. |
| 2008/0188063 | A1 | 8/2008 | Alivisatos et al. |
| 2008/0220593 | A1 | 9/2008 | Pickett et al. |
| 2008/0264473 | A1 | 10/2008 | Cumpston et al. |
| 2008/0268248 | A1 | 10/2008 | Jang et al. |

(Continued)

FOREIGN PATENT DOCUMENTS

| | | |
|---|---|---|
| WO | WO2008063658 A2 | 5/2008 |
| WO | 2009035657 A1 | 3/2009 |

(Continued)

OTHER PUBLICATIONS

Bala, et al., "Interaction of Different Metal Ions with Carboxylic Acid Group: A Quantitative Study", J. Phys. Chem. A (2007), vol. 111, pp. 6183-6190.
Cumberland, et al., "Inorganic Clusters as Single-Source Precursor for Preparation of CdSe, ZnSe, and CdSe/ZnS Nanomaterials", Chem of Mater. (2002) vol. 14.
Dabbousi, et al., "(CdSe) ZnS Core-Shell Quantum Dots: Synthesis and Characterizaqtion of a Size Series of Highly Luminescent Nanocrystallites", J. Phys. Chem. 101, 9463, 1997.
De Mello, J.C., "An Improved Experimental Determination Of External Photoluminescence Quantum Efficiency", Advanced Materials vol. 9 (3) pp. 230-232 (1997).

(Continued)

Primary Examiner — David Spalla
(74) Attorney, Agent, or Firm — Cantor Colburn LLP

(57) ABSTRACT

A coated quantum dot and methods of making coated quantum dots are provided.

9 Claims, No Drawings

(56) References Cited

U.S. PATENT DOCUMENTS

| | | |
|---|---|---|
| 2008/0296144 A1 | 12/2008 | Strouse et al. |
| 2008/0316576 A1 | 12/2008 | Molenkamp et al. |
| 2009/0162011 A1 | 6/2009 | Coe-Sullivan et al. |
| 2009/0203196 A1 | 8/2009 | Kim et al. |
| 2009/0217970 A1 | 9/2009 | Zimmerman et al. |
| 2009/0278141 A1 | 11/2009 | Coe-Sullivan et al. |
| 2010/0009338 A1 | 1/2010 | Zhang et al. |
| 2010/0052512 A1 | 3/2010 | Clough et al. |
| 2010/0062154 A1 | 3/2010 | Shin et al. |
| 2010/0108530 A1 | 5/2010 | Zehnder et al. |
| 2010/0140586 A1 | 6/2010 | Char et al. |
| 2010/0258789 A1 | 10/2010 | Akai et al. |
| 2010/0264371 A1 | 10/2010 | Nick |
| 2010/0265307 A1 | 10/2010 | Linton et al. |
| 2010/0283014 A1 | 11/2010 | Breen et al. |
| 2010/0283036 A1 | 11/2010 | Coe-Sullivan et al. |
| 2010/0283072 A1 | 11/2010 | Kazlas et al. |
| 2010/0289003 A1 | 11/2010 | Kahen et al. |
| 2010/0289044 A1 | 11/2010 | Krames et al. |
| 2011/0006285 A1 | 1/2011 | Lifshitz et al. |
| 2011/0031452 A1 | 2/2011 | Krauss et al. |
| 2011/0052918 A1 | 3/2011 | Krauss et al. |
| 2011/0080090 A1 | 4/2011 | Wood et al. |
| 2011/0081538 A1 | 4/2011 | Linton |
| 2011/0103055 A1 | 5/2011 | Carroll |
| 2011/0103064 A1 | 5/2011 | Coe-Sullivan et al. |
| 2011/0129420 A1 | 6/2011 | Allen et al. |
| 2011/0175030 A1 | 7/2011 | Ren et al. |
| 2011/0186811 A1 | 8/2011 | Coe-Sullivan et al. |
| 2011/0220194 A1 | 9/2011 | Kurtin et al. |
| 2011/0220844 A1 | 9/2011 | Tulsky et al. |
| 2011/0226991 A1* | 9/2011 | Treadway .......... A61K 49/0067 252/301.6 S |
| 2011/0229397 A1 | 9/2011 | Bartel et al. |
| 2011/0233468 A1 | 9/2011 | Zong et al. |
| 2011/0245533 A1 | 10/2011 | Breen et al. |
| 2011/0260111 A1 | 10/2011 | Nie et al. |
| 2011/0262752 A1 | 10/2011 | Bawendi et al. |
| 2011/0309238 A1 | 12/2011 | Tian et al. |
| 2011/0309325 A1 | 12/2011 | Park et al. |
| 2012/0018675 A1 | 1/2012 | Okuyama et al. |
| 2012/0049119 A1 | 3/2012 | Greytak et al. |
| 2012/0113671 A1 | 5/2012 | Sadasivan et al. |
| 2012/0175588 A1* | 7/2012 | Qiao .................... C09K 11/883 257/13 |
| 2012/0187367 A1 | 7/2012 | Modi et al. |
| 2012/0189791 A1 | 7/2012 | Modi et al. |
| 2012/0250351 A1 | 10/2012 | Shin et al. |
| 2012/0256141 A1 | 10/2012 | Nick et al. |
| 2012/0286238 A1 | 11/2012 | Linton et al. |
| 2012/0313075 A1 | 12/2012 | Linton et al. |
| 2012/0329042 A1* | 12/2012 | Beechem .............. C07H 19/20 435/6.1 |
| 2013/0069018 A1 | 3/2013 | Zhu et al. |
| 2013/0169904 A1 | 7/2013 | Kang et al. |
| 2013/0175514 A1 | 7/2013 | Han et al. |
| 2013/0193407 A1 | 8/2013 | Clough et al. |
| 2014/0049155 A1 | 2/2014 | Kurtin |
| 2014/0198142 A1 | 7/2014 | Whitehead et al. |
| 2014/0227862 A1 | 8/2014 | Song et al. |
| 2014/0312300 A1 | 10/2014 | Ramprasad |
| 2014/0322901 A1 | 10/2014 | Huang et al. |
| 2014/0334181 A1 | 11/2014 | Hu et al. |
| 2015/0003043 A1 | 1/2015 | Ke |
| 2015/0013589 A1 | 1/2015 | Liu et al. |
| 2015/0014586 A1 | 1/2015 | Liu et al. |
| 2015/0021548 A1 | 1/2015 | Liu et al. |
| 2015/0021551 A1 | 1/2015 | Breen et al. |
| 2015/0166341 A1 | 6/2015 | Hamilton et al. |
| 2015/0171268 A1 | 6/2015 | Breen et al. |
| 2015/0184074 A1 | 7/2015 | Breen et al. |
| 2015/0191617 A1 | 7/2015 | Linton et al. |

FOREIGN PATENT DOCUMENTS

| | | |
|---|---|---|
| WO | 2010014198 A1 | 2/2010 |
| WO | WO2013078242 A1 | 5/2013 |
| WO | WO2013078245 A1 | 5/2013 |
| WO | WO2013078247 A1 | 5/2013 |
| WO | WO2013078249 A1 | 5/2013 |
| WO | WO2013115898 A2 | 8/2013 |
| WO | WO2013162646 A1 | 10/2013 |

OTHER PUBLICATIONS

Donegá, et al., "Physicochemical Evaluation of the Hot-Injection Method, a Synthesis Route for Monodisperse Nanocrystals", *small* (2005), vol. 1, No. 12, pp. 1152-1162.

Dukes III, et al., "Luminescent Quantum Dots", ECS Transactions (2011), vol. 33, No. 33, pp. 3-16.

Gong, "Synthesis, optical properties, and surface modification of magic-size semiconductor nanocrystals, nanowires and nanoplatelets" San Diego State University, 2011. <http://sdsu-dspace.calstate.edu/handle/10211.10/1438>.

Jang, et al., "High quality CdSeS nanocrystals synthsized by facile single injection process and their electroluminescence", *Chem. Commun.* (2003) pp. 2964-2966.

Jing, et al., "Temperature-Dependent Photoluminescence of CdSe-Core CdS/CdZnS/ZnS-Multishell Quantum Dots", *J. Phys. Chem C* (2009), vol. 113, pp. 13545-13550.

Koole, et al., "Paramagnetic lipid-coated silica nanoparticles with a fluorescent quantum dot core: a new contrast agent platform for multimodality imaging", *Bioconjugate Chemistry* (2008) vol. 19, No. 12, pp. 2471-2479.

Murray, Christopher, Thesis entitled "Synthesis and Characterization of II-VI Quantum Dots and Their Assembly into 3-D Quantum Dot Superlattices", Massachusetts Institute of Technology, Sep. 1995.

Murray, C., et al., "Synthesis and Characterization of Nearly Monodisperse CdE (E=S, Se, Te) Semiconductor Nanocrystallites" (Nov. 1993), *J. Am. Chem. Soc.*, 115, pp. 8706-8715.

Murray, C.B., et al., "Synthesis and Characterization of Monodisperse Nanocrystals and Close-Packed Nanocrystal Assemblies", Annu. Rev. Mater. Sci., 2000, 30: pp. 545-610.

PCT/US2012/066137 Search Report and Written Opinion dated Feb. 5, 2013. PCT/US2012/066137 is the parent of this case.

Peng, X., et al., "Kinetics of II-VI and III-V Colloidal Semiconductor Nanocrystal Growth: 'Focusing' of Size Distributions", *J. Am. Chem. Soc.* (1998), vol. 120, pp. 5343-5344.

Peng, Z., et al., "Mechanisms of the Shape Evolution of CdSe Nanocrystals", *J. Am. Chem. Soc.* (2001) vol. 123. <http://jpkc2.wzu.edu.cn/clwlhx/uploadfile/201012/20101221014330816.pdf>.

Quantum Dots begin to impact backlight and general illumination applications. *LEDs Magazine*, Feb. 9, 2010. <http://ledsmagazine.com/news/7/2/12>.

Reiss, H., "The Growth of Uniform Colloidal Dispersions", J. Chem. Phys. (1951), vol. 19, No. 4, pp. 482-487.

Shen, et al., "One-Step Synthesis of White-Light-Emitting Quantum Dots at Low Temperature", *Inorg. Chem.* (2009), vol. 48, No. 18, pp. 8689-8694.

* cited by examiner

METHODS FOR COATING SEMICONDUCTOR NANOCRYSTALS

This application is a continuation of International Application No. PCT/US2012/066137, filed 20 Nov. 2012, which was published in the English language as International Publication No. WO 2013/078242 on 30 May 2013, which International Application claims priority to U.S. Provisional Patent Application No. 61/562,457, filed on 22 Nov. 2011. Each of the foregoing is hereby incorporated herein by reference in its entirety for all purposes.

TECHNICAL FIELD OF THE INVENTION

The present invention relates to semiconductor nanocrystals, also referred to as quantum dots, and to methods of coating or providing layers on quantum dots.

BACKGROUND OF THE INVENTION

Methods of making quantum dots are in the literature. For example, see US 20106849, U.S. Pat. No. 7,476,599 and WO 2009/120688. However, additional methods of making quantum dots with coatings or layers are desirable.

BRIEF SUMMARY OF THE INVENTION

The present invention relates to quantum dots including an overcoating, methods for overcoating quantum dots, materials and products including quantum dots taught herein, and materials and products including quantum dots made by a method taught herein.

Embodiments of the present invention are directed to methods of providing one or more coatings or layers or shells on quantum dots. According to one aspect, a quantum dot to be provided with a coating or layer or shell may be referred to as a "core" particle or a "core" quantum dot. According to an additional aspect, the core particle is subjected to a high temperature process that forms a coating or layer or shell on the core particle to produce a core-shell quantum dot.

According to one aspect, free, unbound phosphonic acid or metal phosphonate species are not present or are not substantially present in the core quantum dots prior to providing a coating or layer or shell on the core quantum dots.

According to one aspect, the core particle on which a coating or layer or shell is to be formed is substantially free of phosphonic acid or metal phosphonate species. According to one aspect, the core particle on which a coating or layer or shell is to be formed is substantially free of phosphonic acid or metal phosphonate species at the surface of the core particle (e.g., whether as free, unreacted or unbound species or as bound ligands). According to one aspect, the coating, layer or shell on a core particle is formed without addition of phosphonic acid or metal phosphonate species. According to one aspect, the coating, layer or shell on a core particle is substantially free of phosphonic acid or metal phosphonate species at the surface of the coating, layer or shell.

According to one aspect, the core particle on which a coating or layer or shell is to be formed is substantially free of free, unreacted or unbound phosphonic acid or metal phosphonate species. Phosphonic acid or metal phosphonate precursors may not be used in certain exemplary embodiments to make the core quantum dots of the present invention and therefore may not be present as metal phosphonate ligand species bound to the core quantum dot. Such a core quantum dot is envisioned within the scope of the present invention. Phosphonic acid or metal phosphonate precursors may be used in certain exemplary embodiments to make the core quantum dots of the present invention and may result in phosphonic acid species or metal phosphonate ligand species bound to the core quantum dot. Such a core quantum dot is envisioned within the scope of the present invention.

According to an additional aspect, phosphonic acid or metal phosphonate species are present as phosphonic acid or metal phosphonate ligand species bound to the core quantum dot prior to providing a coating or layer or shell on the core quantum dots, where the reactants producing the coating or layer or shell do not include phosphonic acid or metal phosphonate species or where the method results in a lack of phosphonic acid or metal phosphonate species at the surface or otherwise.

According to an additional aspect, phosphonic acid or metal phosphonate species are not present or are not substantially present as bound ligands to the core quantum dots prior to providing a coating or layer or shell on the core quantum dots, where the reactants producing the coating or layer or shell do or do not include phosphonic acid or metal phosphonate species.

According to an additional aspect, free, unreacted or unbound phosphonic acid or metal phosphonate species are not present or are not substantially present in the core quantum dots prior to providing a coating or layer or shell on the core quantum dots, where the reactants producing the coating or layer or shell do or do not include phosphonic acid or metal phosphonate species.

According to an additional aspect, free, unreacted or unbound phosphonic acid or metal phosphonate species are not present or are not substantially present in the core quantum dots and phosphonic acid or metal phosphonate species are not present or are not substantially present as bound ligands to the core quantum dots prior to providing a coating or layer or shell on the core quantum dots, where the reactants producing the coating or layer or shell do or do not include phosphonic acid or metal phosphonate species.

According to an additional aspect, free, unreacted or unbound phosphonic acid or metal phosphonate species are removed or substantially removed from the core quantum dots prior to providing a coating or layer or shell on the core quantum dots, whether the reactants producing the coating or layer or shell do or do not include phosphonic acid or metal phosphonate species. According to a certain aspect, phosphonic acid or metal phosphonate precursors when used as reactants to make quantum dots may not result in free, unreacted or unbound phosphonic acid or metal phosphonate species in the resulting quantum dots due to the phosphonic acid or metal phosphonate precursors being substantially entirely reacted or otherwise used during the process of making the quantum dots thereby resulting in little or no free, unreacted or unbound phosphonic acid or metal phosphonate species in the quantum dots. According to this aspect, free, unreacted or unbound phosphonic acid or metal phosphonate species need not be removed from the quantum dots due to their absence or substantial absence as a result of the efficiency of the reaction process used to make the quantum dots. The absence or substantial absence of phosphonic acid or metal phosphonate species whether as bound ligands or as free, unreacted or unbound phosphonic acid or metal phosphonate species in the core particles prior to providing a coating or layer or shell on the core quantum dots allows for enhanced performance of the resulting core-shell quantum dots, such as for example, where a high temperature overcoating process is used. In an exemplary embodiment, a high temperature overcoating process is a process where a coating or layer or shell is provided on the surface of a core quantum dot at a temperature of greater than 230° C., greater than 240° C., greater than 250° C., greater than 260° C., greater than 270° C., greater than 280° C., greater than 290° C., greater than 300° C., greater than 310° C., or greater than 320° C.

Core quantum dot particles having an absence or substantial absence of phosphonic acid or metal phosphonate species may then be subjected to conditions, such as high temperature conditions, and reactants to provide a coating or layer or shell on the core quantum dots thereby resulting in a core-shell quantum dot. Exemplary methods of providing a core quantum dot with one or more coatings, layers or shells are described herein. Exemplary methods of providing a core quantum dot with one or more coatings, layers or shells are known to those of skill in the art. According to one aspect, a reaction mixture of core quantum dot particles and coating reactants is provided which lacks phosphonic acid or metal phosphonate species or where phosphonic acid or metal phosphonate species are substantially absent from the reaction mixture. According to an additional aspect, a method of making core-shell quantum dots is provided which lacks phosphonic acid or metal phosphonate species in the reaction mixture used to form one or more coatings, layers or shells on core quantum dot particles or where phosphonic acid or metal phosphonate species are substantially absent from the reaction mixture. According to one aspect, the core quantum dot particle may be substantially free of free, unreacted or unbound phosphonic acid or metal phosphonate species and then may be coated or layered or shelled with a reaction mixture lacking phosphonic acid or metal phosphonate species. According to an additional aspect, the core quantum dot particle may include metal phosphonate ligand species and be substantially free of free, unreacted or unbound phosphonic acid or metal phosphonate species and then may be coated or layered or shelled with a reaction mixture lacking phosphonic acid or metal phosphonate species.

According to an additional aspect, core quantum dots having phosphonic acid or metal phosphonate species bound thereto as ligands or otherwise are subject to a reaction mixture of a metal carboxylate precursor compound and a chalcogenide source wherein phosphonic acid or metal phosphonate species are substantially absent from the reaction mixture, whereby the bound phosphonic acid or metal phosphonate species are removed from the surface of the core quantum dots and wherein a coating or layer or shell is provided on the core quantum dots.

Embodiments of the present invention are further directed to methods of increasing, improving or enhancing emission of quantum dots or otherwise increasing, improving or enhancing the lifetime of quantum dots. According to certain aspects, core quantum dots are provided which lack or substantially lack phosphonic acid or metal phosphonate species. The quantum dots are then coated to result in core-shell quantum dots having increased, improved or enhanced emission or an increased, improved or enhanced lifetime. According to an additional aspect, materials for one or more coatings or layers or shells are selected. A core quantum dot particle, which may lack or substantially lack phosphonic acid or metal phosphonate species, is then provided with one or more coatings or layers or shells of a same or different material to result in core-shell quantum dots having increased, improved or enhanced emission.

The core-shell quantum dots of the present invention may be present, for example, in a matrix or host material and placed in capillaries which are used, for example, in back light units. The quantum dots may also be used in films or solid state lighting applications or in any application utilizing quantum dots, such as direct on-chip semiconductor LED applications, electroluminescent applications such as QLEDs, solar applications such as photovoltaic cells and concentrators, and diagnostic and medical applications such as labeling, imaging and the like.

Each of the original claims set forth at the end of the present application are hereby incorporated into this Summary section by reference in its entirety.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this invention.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

DETAILED DESCRIPTION

Embodiments of the present invention are directed to methods of overcoating quantum dots resulting in an absence or substantial absence of phosphonic acid or metal phosphonate species in the quantum dots. According to one aspect, core quantum dots having an absence or substantial absence of phosphonic acid or metal phosphonate species are then provided with one or more coatings or layers or shells of a same or different material to provide a core-shell quantum dot. According to an additional aspect, core quantum dots which may or may not have an absence or substantial absence of phosphonic acid or metal phosphonate species are provided thereon with one or more coatings or layers or shells of a same or different material to provide a core-shell quantum dot.

Examples of phosphonic acid or metal phosphonate species to be absent from or substantially absent from or excluded from or substantially excluded from core quantum dot particles include phosphine based compounds such as phosphines, alkyl phosphines, phosphine oxides, alkyl phosphine oxides, phosphonic acids, alkyl phosphonic acids, phosphinic acids, alkyl phosphinic acids, phosphonates, alkyl phosphonates and metal phosphonates, as well as reaction products of each of the above. Exemplary compounds include, but are not limited to, tri-n-octyl phosphine (TOP), tri-n-octyl phosphine oxide (TOPO), tris-hydroxylpropylphosphine (tHPP), tetradecylphosphonic acid ("TDPA") and octadecylphosphonic acid ("ODPA") and reaction products of each of these compounds. Metals of metal phosphonate species include those metals used to make core quantum dot particles and include $Cd(ODPA)_2$, $Cd(TDPA)_2$ and the like. Quantum dots or nanocrystals are nanometer sized semiconductor particles that can have optical properties arising from quantum confinement. Quantum dots can have various shapes, including, but not limited to a sphere, rod, disk, other shapes, and mixtures of various shaped particles. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size. See C. B. Murray, C. R. Kagan, and M. G. Bawendi, *Annual Review of Material Sci.*, 2000, 30: 545-610 hereby incorporated by reference in its entirety. The narrow FWHM of quantum dots can result in saturated color emission. The broadly tunable, saturated color emission over the entire visible spectrum of a single material system is unmatched by any class of organic chromophores (see, for example, Dabbousi et al., *J. Phys. Chem.* 101, 9463 (1997), which is incorporated by reference in its entirety). A monodisperse population of quantum dots will emit light spanning a narrow range of wavelengths.

Exemplary quantum dots include, for example, quantum dots comprising a semiconductor material that can be represented by the formula MX, wherein M represents one or more metals and X represents one or more chalcogens or one more pnictogens. Such quantum dots can be formed from quantum dot precursors comprising one or more metal sources or M donors and one or more X donors which is capable of reacting with the metal source to form a material with the general formula MX. In certain embodiments, the M donor and the X donor can be moieties within the same molecule. The M donor can be an inorganic compound, an organometallic compound, or elemental metal. For example, an M donor can comprise cadmium, zinc, magnesium, mercury, aluminum, gallium, indium or thallium, and the X donor can comprise a compound capable of reacting with the M donor to form a material with the general formula MX. Exemplary metal precursors include metal carboxylates. Exemplary metal precursors include dimethylcadmium and cadmium oleate. The X donor can comprise a chalcogenide donor or source or a pnictide donor, such as a phosphine chalcogenide, a bis(silyl) chalcogenide, dioxygen, an ammonium salt, or a tris(silyl) pnictide. Suitable X donors include, for example, but are not limited to, dioxygen, bis(trimethylsilyl) selenide ((TMS)$_2$Se), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ((TMS)$_2$Te), bis(trimethylsilyl)sulfide ((TMS)$_2$S), a trialkyl phosphine sulfide such as (tri-noctylphosphine) sulfide (TOPS), dialkyl phosphine selenide, aliphatic thiol, triethyl phosphine sulfide, tributyl phosphine sulfide, sulfur-octadecene, selenium-octadecene, an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A quantum dot can comprise one or more semiconductor materials. Examples of semiconductor materials that can be included in a quantum dot (including, e.g., semiconductor nanocrystal) include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, an alloy including any of the foregoing, and/or a mixture including any of the foregoing, including ternary and quaternary mixtures or alloys. Examples of Group II elements include Zn, Cd, Hg. Examples of Group VI elements include oxygen, sulfur, selenium and tellurium. Examples of Group III elements include boron, aluminum, gallium, indium, and thallium. Examples of Group V elements include nitrogen, phosphorus, arsenic, antimony, and bismuth. Examples of Group IV elements include silicon, germanium, tin, and lead.

A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

In certain embodiments, quantum dots can comprise a core comprising one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

For example, a quantum dot can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as quantum dot cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The X donor can comprise a chalcogenide donor where X is a chalcogenide including oxygen, sulfur, selenium, or tellurium, or mixtures thereof. Suitable chalcogenide donors include a reactive chalcogenide source, such as highly reactive chalcogenide sources such as (TMS)$_2$Se, (TMS)$_2$S, H$_2$S, chalcogenide mixtures such as octadecene-Se, (ODE/Se), octadecene-S (ODE/s), amine-Se, amine-S and mixtures thereof and secondary phosphine chalcogenides such as a secondary phosphine sulfide, a secondary phosphine selenide, a secondary phosphine telluride, or a secondary phosphine oxide or mixtures thereof or dialkylphosphine chalcogenides such as diisobutylphosphine selenides, diisobutylphosphine sulfides, diphenylphosphine selenides or diphenylphosphine sulfides and the like or mixtures of any of the above.

A shell can be a semiconductor material having a composition that is the same as or different from the composition of the core. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core. An example of an overcoating process is described, for example, in U.S. Pat. No. 6,322,901. By adjusting the temperature of the reaction mixture during overcoating and monitoring the absorption spectrum of the core, overcoated materials having high emission quantum efficiencies and narrow size distributions can be obtained. A particularly exemplary coating or layer or shell, such as for a II-VI core quantum dot, includes ZnS and further as a first coating on a II-VI core quantum dot particle. An additional particularly exemplary coating includes $Cd_xZn_{1-x}S$ and further as a second coating over a first ZnS coating on a II-VI core quantum dot particle. Such coatings are advantageous to produce a core-shell quantum dot particle using high temperature coating methods such as methods which use a temperature of about 300° C. and above.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of quantum dot (e.g., semiconductor nanocrystal) (core)shell materials include, without limitation: red (e.g., (CdSe)CdZnS (core)shell), green (e.g., (CdZnSe)CdZnS (core)shell, etc.), and blue (e.g., (CdS)CdZnS (core)shell.) Examples of quantum dot (e.g., semiconductor nanocrystal) (core)shell1/shell2 materials include, without limitation: red (e.g., (CdSe)ZnS/CdZnS or CdSe/ZnS/CdS (core)shell1/shell2), green (e.g., (CdZnSe)ZnS/CdZnS, CdSe/ZnS/ZnS, or (CdSe)ZnS/CdZnS (core)shell1/shell2, etc.), and blue (e.g., (CdS)ZnS/CdZnS or CdSe/ZnS/ZnS (core)shell1/shell2.)

Quantum dots can have various shapes, including, but not limited to, sphere, rod, disk, other shapes, and mixtures of various shaped particles.

Methods of making quantum dots are known. One example of a method of manufacturing a quantum dot (including, for example, but not limited to, a semiconductor nanocrystal) is a colloidal growth process. Colloidal growth occurs by injection of an M donor and an X donor into a hot coordinating solvent. One example of a preferred method for preparing monodisperse quantum dots comprises pyrolysis of organometallic reagents, such as dimethyl cadmium, injected into a hot, coordinating solvent. This permits discrete nucleation and results in the controlled growth of macroscopic quantities of quantum dots. The injection produces a nucleus that can be grown in a controlled manner to form a quantum dot. The reaction mixture can be gently heated to grow and anneal the quantum dot. Both the average size and the size distribution of the quantum dots in a sample are dependent on the growth temperature. The growth temperature for maintaining steady growth increases with increasing average crystal size. Resulting quantum dots are members of a population of quantum dots. As a result of the discrete nucleation and controlled growth, the population of quantum dots that can be obtained has a narrow, monodisperse distribution of diameters. The monodisperse distribution of diameters can also be referred to as a "size." Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

According to certain methods of making quantum dots, the liquid medium includes solvents such as coordinating solvents. A coordinating solvent can help control the growth of the quantum dot. Alternatively, non-coordinating solvents can also be used in certain applications. A coordinating solvent is a compound having a donor lone pair, for example, a lone electron pair available to coordinate to a surface of the growing quantum dot (including, e.g., a semiconductor nanocrystal). Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the quantum dot (e.g., semiconductor nanocrystal) production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used. As will be appreciated by the skilled artisan, in aspects of the invention calling for the absence or substantial absence of phosphonic or phosphonate species, use of solvents including such species are preferably avoided.

According to certain aspects, reaction conditions in a process for making quantum dots are provided where phosphine components in the reaction mixture are substantially completely reacted or otherwise used during the process such that free or unreacted or unbound phosphonic acid or metal phosphonate species or byproducts thereof are absent or substantially absent in the reaction mixture when quantum dots of desired size are obtained. According to certain aspects, reaction conditions in a process for making quantum dots are provided where phosphine components in the reaction mixture are absent such that free or unreacted or unbound phosphonic acid or metal phosphonate species or byproducts thereof are absent or substantially absent in the reaction mixture when quantum dots of desired size are obtained. When making quantum dots using phosphonic acid or metal phosphonate species resulting in bound phosphonic acid or metal phosphonate species, such bound phosphonic acid or metal phosphonate species may be removed and/or diluted away such as by using a metal carboxylate species during a high temperature coating process resulting in quantum dots which lack or substantially lack phosphonic acid or metal phosphonate species on their surface as bound ligands. Such quantum dots may include II-VI core quantum dots characterized as yellow, orange or red emitters which may be larger in size than quantum dots characterized as green or blue emitters or emitters having an emission of less than 530 nm. According to certain aspects, low energy emitters such as yellow, orange or red quantum dots are made by growing II-VI core quantum dots and substantially completely consuming phosphonic acid or metal phosphonate species in the reaction mixture. Once such cores are precipitated out of solution, there are substantially no phosphonic acid or metal phosphonate species or byproducts thereof remaining in the reaction solution and accordingly in the core quantum dots prior to the coating process. According to an alternate aspect, smaller cores required for making wider bandgap green and blue emitters are produced by quickly quenching the reaction mixture resulting in a large amount of unreacted phosphonic acid or metal phosphonate species remaining in the reaction mixture and accordingly in the core quantum dots. According to one aspect, the presence of unreacted phosphonic acid or metal phosphonate species in the core quantum dots diminishes the emission of the quantum dots. Accordingly, unreacted phosphonic acid or metal phosphonate species are removed from the quantum dots. Methods according to the present invention are directed to making any band gap or color that can be obtained via size changes of the semiconductor used in the core, for example, all visible colors for CdSe or InP.

According to a certain aspect, pure, highly reactive chalcogenide precursors are used in core synthesis under conditions promoting substantially complete reaction of the precursors. Such conditions are known to or can be determined by those of skill in the art. According to this aspect, substantially all of the phosphine based reactants are reacted to form semiconductor core particles and phosphonic acid, metal phosphonate species or byproducts thereof are absent or substantially absent in the reaction mixture when core quantum dots are produced and optionally recovered.

According to an additional aspect, phosphonic acid and/or metal phosphonate species which may be present in core quantum dots are substantially removed from the core quantum dots prior to the coating process, such as by precipitation. According to one aspect, unreacted phosphonic acid and/or metal phosphonate species may be removed from the reaction solution by precipitating out the core quantum dots from the reaction solution and then dissolving the core quantum dots in octadecene which will cause unreacted phosphonic acid and/or metal phosphonate species to precipitate from the solution. The precipitated phosphonic acid and/or metal phosphonate species can then be removed by filtration. Alternatively, unreacted phosphonic acid and/or metal phosphonate species may be removed from the reaction solution by precipitating out the core quantum dots from the reaction solution and then dissolving the core quantum dots in hexane. This solution can then be added to octadecene followed by removal of the hexane. Removal of the hexane will cause the unreacted phosphonic acid and/or metal phosphonate species to precipitate from the octadecene solution. The precipitated phosphonic acid and/or metal phosphonate species can then be removed by filtration.

The narrow size distribution of the quantum dots (including, e.g., semiconductor nanocrystals) allows the possibility of light emission in narrow spectral widths. Monodisperse semiconductor nanocrystals have been described in detail in Murray et al. (*J. Am. Chem. Soc.*, 115:8706 (1993)) and in the thesis of Christopher Murray entitled "Synthesis and Characterization of II-VI Quantum Dots and Their Assembly into 3-D Quantum Dot Superlattices", Massachusetts Institute of Technology, September, 1995. The foregoing are hereby incorporated herein by reference in their entireties.

The process of controlled growth and annealing of the quantum dots in the coordinating solvent that follows nucleation can also result in uniform surface derivatization and regular core structures. As the size distribution sharpens, the temperature can be raised to maintain steady growth. By adding more M donor or X donor, the growth period can be shortened. Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

Semiconductor nanocrystals and other types of quantum dots preferably have ligands attached thereto. According to one aspect, quantum dots within the scope of the present invention include green CdSe quantum dots having oleic acid ligands and red CdSe quantum dots having oleic acid ligands. Alternatively, or in addition, octadecylphosphonic acid ("ODPA") ligands may be used instead of oleic acid ligands. The ligands promote solubility of the quantum dots in the polymerizable composition which allows higher loadings without agglomeration which can lead to red shifting.

Ligands can be derived from a coordinating solvent that may be included in the reaction mixture during the growth process. Ligands can be added to the reaction mixture. Ligands can be derived from a reagent or precursor included in the reaction mixture for synthesizing the quantum dots. Ligands can be exchanged with ligands on the surface of a quantum dot. In certain embodiments, quantum dots can include more than one type of ligand attached to an outer surface.

According to one aspect of the present invention, quantum dots described herein include aliphatic ligands attached thereto. Such aliphatic ligands promote adhesion with a carrier particle. Such aliphatic ligands promote solubility or dispersability of the quantum dots bound to the carrier particles in a curable or polymerizable matrix material. According to one aspect, exemplary ligands include fatty acid ligands, long chain fatty acid ligands, oleic acid ligands and octadecylphosphonic acid ("ODPA") ligands.

Ligands can be derived from a coordinating solvent that may be included in the reaction mixture during the growth process. Alternatively, ligands can be added to the reaction mixture or ligands can be derived from a reagent or precursor included in the reaction mixture for synthesizing the quantum dots. In certain embodiments, quantum dots can include more than one type of ligand attached to an outer surface.

A quantum dot surface includes ligands derived from the growth process or otherwise can be modified by repeated exposure to an excess of a competing ligand group (including, e.g., but not limited to, a coordinating group) to form an overlayer. For example, a dispersion of the capped quantum dots can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the quantum dot, including, for example, but not limited to, phosphines, thiols, amines and phosphates.

For example, a quantum dot can be exposed to short chain polymers which exhibit an affinity for the surface and which terminate in a moiety having an affinity for a suspension or dispersion medium. Such affinity improves the stability of the suspension and discourages flocculation of the quantum dot. Examples of additional ligands include fatty acids, long chain fatty acids, oleic acid, alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used. As will be appreciated by the skilled artisan, in aspects of the invention calling for the absence or substantial absence of phosphonic or phosphonate species, use of ligands including such species are preferably avoided.

Suitable coordinating ligands can be purchased commercially or prepared by ordinary synthetic organic techniques, for example, as described in J. March, Advanced Organic Chemistry, which is incorporated herein by reference in its entirety.

According to an additional aspect, the surface of core quantum dots can be altered or supplemented or otherwise reconstructed using metal carboxylate species. This is particularly advantageous to remove phosphonic acid or metal phosphionate species which may be bound to the core quantum dot. According to this aspect, CdSe, ZnS or ZnSe may be grown on core quantum dots using carboxylate based precursors including Cd(oleate)$_2$ and the like and then coated with $Cd_xZn_{1-x}S$ in situ. Alternatively, the quantum dots may be isolated and then coated with $Cd_xZn_{1-x}S$ using the high temperature coating methods described herein.

According to one embodiment exemplary for making green quantum dots, 480 nm absorbing cores are first synthesized in the presence of phosphonic acids. The cores are purified by precipitation. The shell growth is a 2-step process. The first shell is ZnS and uses a metal oleate such as Zn(Oleate) and octanethiol as precursors at a high temperature of about 300° C. In this first shell, the core quantum surface is converted from being phosphonic acid rich to one that is oleic acid rich. The second shell is $Cd_xZn_{1-x}S$ and is applied in-situ on top of the first shell at a high temperature of about 300° C.

In another example, the first shell for the 480 nm CdSe core uses Cd(Oleate)$_2$ and a dialkylphosphine selenide precursor to create a CdSe layer on top of the 480 nm CdSe core. According to this aspect, the size of the CdSe particle is increased with the surface of the resulting quantum dot particle being oleic acid rich instead of phosphonic acid rich due to the use of Cd(Oleate)$_2$ in the coating process.

According to a certain aspect, the use of carboxylate based precursors with small CdSe core quantum dots (less than 500 nm absorbance peak) to further grow the size of the quantum dots results in the surface of the quantum dots having a plurality of carboxylic acid ligands. According to this aspect, the Cd precursor may be carboxylate based including Cd(oleate)$_2$ and the Se precursor may be dialkylphosphine-selenide such as diisobutylphosphine selenide or diphenylphosphine selenide. The growth process produces high quality monodisperse CdSe cores with a first absorbance peak tunable between 500-600 nm. The growth process allows in-situ high temperature overcoating using $Cd_xZn_{1-x}S$ for producing red emitters emitting between 600-630 nm with high solution QY (about 80%), narrow FWHM (25-30 nm) and high external quantum efficiency in the solid state (90-95%).

According to one aspect, a method of making quantum dots having a coating thereon is provided including providing a reaction mixture including core quantum dots, one or more metal carboxylates and one or more chalcogenide sources at a temperature of greater than 240° C. to form a first coating on the core quantum dots from the metal carboxylate and chalcogenide source to form first coated quantum dots, wherein the metal and chalcogenide of the first coating are the same or different from elements included in the core and combining one or more metal precursors and one or more chalcogen precursors with the first coated quantum dots to form a second coating on the first coated quantum dots from the one or more metals and one or more chalcogens included in the precursors, wherein the one or more metals and one or more chalcogens included in the second coating comprises a composition that is different from the composition of at least one of the core or the first coating.

According to an additional aspect, a method of making quantum dots having a coating thereon is provided which includes providing a reaction mixture of core quantum dots, a metal carboxylate and a chalcogenide source at a temperature of greater than 240° C. wherein unbound phosphonic acid or unbound metal phosphonate species are substantially absent from the reaction mixture; providing a first coating on the core quantum dots from the metal carboxylate and chalcogenide source to form first coated quantum dots, wherein the metal and chalcogenide of the core quantum dots are the same or different from the metal and chalcogenide of the first coating; combining an additional metal carboxylate and an additional chalcogenide source with the first coated quantum dots at a temperature of greater than 280° C. wherein unbound phosphonic acid or unbound metal phosphonate species are substantially absent from the combination; and providing a second coating on the first coated quantum dots from the additional metal carboxylate and the additional chalcogenide source, wherein the metal and chalcogenide of the core quantum dots are different from the metal and chalcogenide of the first coating. According to one aspect, the core quantum dots include group II-VI elements. According to one aspect, the first coating includes group II-VI elements. According to one aspect, the second coating includes group II-VI elements. According to one aspect, the second coating is $Cd_xZn_{1-x}S$. According to one aspect, the core quantum dots are CdSe quantum dots. According to one aspect, unbound phosphonic acid or unbound metal phosphonate species are substantially removed from the core quantum dots prior to the core quantum dots receiving a first coating. According to one aspect, unbound phosphonic acid or unbound metal phosphonate species are substantially removed from the core quantum dots by placing the quantum dots in a fluid causing precipitation of the phosphonic acid or metal phosphonate species from the fluid. According to one aspect, the fluid is octadecene. According to one aspect, the core quantum dots have bound phosphonic acid or bound metal phosphonate species. According to one aspect, the bound phosphonic acid or bound metal phosphonate species are removed from the core quantum dots prior to the core quantum dots receiving a first coating. According to one aspect, the metal carboxylate and the chalcogenide source are highly reactive. According to one aspect, the metal carboxylate and the chalcogenide source react substantially immediately with each other at the reaction temperature to form nuclei of a predetermined semiconductor material.

Additional aspects of the present invention include a reaction mixture for use in coating quantum dots including core quantum dots, a metal carboxylate and a chalcogenide source in the substantial absence of phosphonic acid or metal phosphonate species.

Additional aspects of the present invention include core quantum dots having phosphonic acid or metal phosphonate species substantially absent therefrom.

Additional aspects of the present invention include a method of making quantum dots having a coating thereon comprising coating core quantum dots with a semiconductor shell in the substantial absence of phosphonic acid or metal phosphonate species.

Additional aspects of the present invention include a core quantum dot substantially absent of phosphonic acid or metal phosphonate species and at least one semiconductor shell.

The emission from a quantum dot capable of emitting light can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light can result in emission of light in a narrow spectral range. The population can be monodisperse preferably exhibiting less than a 15% rms (root-mean-square) deviation in diameter of such quantum dots, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

Quantum dots can have emission quantum efficiencies such as between 0% to greater than 95%, for example in solution, such as greater than 10%, 20%, 30%, 40%, 50%, 60%, 70%, 80%, or 90%.

The narrow FWHM of quantum dots can result in saturated color emission. The broadly tunable, saturated color emission over the entire visible spectrum of a single material system is unmatched by any class of organic chromophores (see, for example, Dabbousi et al., *J. Phys, Chem.* 101, 9463 (1997), which is incorporated by reference in its entirety). A monodisperse population of quantum dots will emit light spanning a narrow range of wavelengths.

In certain embodiments of the present invention, quantum dots that emit wavelengths characteristic of red light are desirable. In certain preferred embodiments, quantum dots capable of emitting red light emit light having a peak center wavelength in a range from about 615 nm to about 635 nm, and any wavelength in between whether overlapping or not. For example, the quantum dots can be capable or emitting red light having a peak center wavelength of about 630 nm, of about 625 nm, of about 620 nm, or of about 615 nm.

In certain embodiments of the present invention, quantum dots that emit wavelengths characteristic of green light are desirable. In certain preferred embodiments, quantum dots capable of emitting green light emit light having a peak center wavelength in a range from about 520 nm to about 545 nm, and any wavelength in between whether overlapping or not. For example, the quantum dots can be capable of emitting green light having a peak center wavelength of about 520 nm, of about 525 nm, of about 535 nm, or of about 540 nm.

According to further aspects of the present invention, the quantum dots exhibit a narrow emission profile in the range of between about 23 nm and about 60 nm at full width half maximum (FWHM). The narrow emission profile of quantum dots of the present invention allows the tuning of the quantum dots and mixtures of quantum dots to emit saturated colors thereby increasing color gamut and power efficiency beyond that of conventional LED lighting displays. According to one aspect, green quantum dots designed to emit a predominant wavelength of, for example, about 523 nm and having an emission profile with a FWHM of about, for example, 37 nm are combined, mixed or otherwise used in combination with red quantum dots designed to emit a predominant wavelength of about, for example, 617 nm and having an emission profile with a FWHM of about, for example 32 nm. Such combinations can be stimulated by blue light to create trichromatic white light.

Quantum dots in accordance with the present invention can be included in various formulations depending upon the desired utility. According to one aspect, quantum dots are included in flowable formulations or liquids to be included, for example, into clear vessels which are to be exposed to light. Such formulations can include various amounts of one or more type of quantum dots and one or more host materials. Such formulations can further include one or more scatterers. Other optional additives or ingredients can also be included in a formulation. In certain embodiments, a formulation can further include one or more photo initiators. One of skill in the art will readily recognize from the present invention that additional ingredients can be included depending upon the particular intended application for the quantum dots.

An optical material or formulation within the scope of the invention may include a host material, such as in the case of a quantum light optic, which may be present in an amount from about 50 weight percent and about 99.5 weight percent, and any weight percent in between whether overlapping or not. In certain embodiments, a host material may be present in an amount from about 80 to about 99.5 weight percent. Examples of specific useful host materials include, but are not limited to, polymers, oligomers, monomers, resins, binders, glasses, metal oxides, and other nonpolymeric materials. Preferred host materials include polymeric and non-polymeric materials that are at least partially transparent, and preferably fully transparent, to preselected wavelengths of light. In certain embodiments, the preselected wavelengths can include wavelengths of light in the visible (e.g., 400-700 nm) region of the electromagnetic spectrum. Preferred host materials include cross-linked polymers and solvent-cast polymers. Examples of other preferred host materials include, but are not limited to, glass or a transparent resin. In particular, a resin such as a non-curable resin, heat-curable resin, or photocurable resin is suitably used from the viewpoint of processability. Specific examples of such a resin, in the form of either an oligomer or a polymer, include, but are not limited to, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like. Other suitable host materials can be identified by persons of ordinary skill in the relevant art.

Host materials can also comprise silicone materials. Suitable host materials comprising silicone materials can be identified by persons of ordinary skill in the relevant art.

In certain embodiments and aspects of the inventions contemplated by this invention, a host material comprises a photocurable resin. A photocurable resin may be a preferred host material in certain embodiments, e.g., in embodiments in which the composition is to be patterned. As a photocurable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

In certain embodiments and aspects of the inventions contemplated by this invention, a host material can comprise a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like can be dissolved in solvents known to those skilled in the art. Upon evaporation of the solvent, the resin forms a solid host material for the semiconductor nanoparticles.

In certain embodiments, acrylate monomers and/or acrylate oligomers which are commercially available from Radcure and Sartomer can be preferred.

Quantum dots can be encapsulated. Nonlimiting examples of encapsulation materials, related methods, and other information that may be useful are described in International Application No. PCT/US2009/01372 of Linton, filed 4 Mar. 2009 entitled "Particles Including Nanoparticles, Uses Thereof, And Methods" and U.S. Patent Application No. 61/240,932 of Nick et al., filed 9 Sep. 2009 entitled "Particles Including Nanoparticles, Uses Thereof, And Methods", each of the foregoing being hereby incorporated herein by reference in its entirety.

The total amount of quantum dots included in an optical material, such as a host material for example a polymer matrix, within the scope of the invention is preferably in a range from about 0.05 weight percent to about 5 weight percent, and any weight percent in between whether overlapping or not. The amount of quantum dots included in an optical material can vary within such range depending upon the application and the form in which the quantum dots are included (e.g., film, optics (e.g., capillary), encapsulated film, etc.), which can be chosen based on the particular end application. For instance, when an optic material is used in a thicker capillary with a longer pathlength (e.g., such as in BLUs for large screen television applications), the concentration of quantum dots can be closer to 0.5%. When an optical material is used in a thinner capillary with a shorter pathlength (e.g., such as in BLUs for mobile or hand-held applications), the concentration of quantum dots can be closer to 5%.

The ratio of quantum dots used in an optical material is determined by the emission peaks of the quantum dots used. For example, when quantum dots capable of emitting green light having a peak center wavelength in a range from about 514 nm to about 545 nm, and any wavelength in between whether overlapping or not, and quantum dots capable of emitting red light having a peak center wavelength in a range from about 615 nm to about 640 nm, and any wavelength in between whether overlapping or not, are used in an optical material, the ratio of the weight percent green-emitting quantum dots to the weight percent of red-emitting quantum dots can be in a range from about 12:1 to about 1:1, and any ratio in between whether overlapping or not.

The above ratio of weight percent green-emitting quantum dots to weight percent red-emitting quantum dots in an optical material can alternatively be presented as a molar ratio. For example, the above weight percent ratio of green to red quantum dots can correspond to a green to red quantum dot molar ratio in a range from about 24.75 to 1 to about 5.5 to 1, and any ratio in between whether overlapping or not.

The ratio of the blue to green to red light output intensity in white trichromatic light emitted by a QD ("quantum dot") containing BLU described herein including blue-emitting solid state inorganic semiconductor light emitting devices (having blue light with a peak center wavelength in a range from about 450 nm to about 460 nm, and any wavelength in between whether overlapping or not), and an optical material including mixtures of green-emitting quantum dots and red-emitting quantum dots within the above range of weight percent ratios can vary within the range. For example, the ratio of blue to green light output intensity therefor can be in a range from about 0.75 to about 4 and the ratio of green to red light output intensity therefor can be in a range from about 0.75 to about 2.0. In certain embodiments, for example, the ratio of blue to green light output intensity can be in a range from about 1.4 to about 2.5 and the ratio of green to red light output intensity can be in a range from about 0.9 to about 1.3.

Scatterers, also referred to as scattering agents, within the scope of the invention may be present, for example, in an amount of between about 0.01 weight percent and about 1 weight percent. Amounts of scatterers outside such range may also be useful. Examples of light scatterers (also referred to herein as scatterers or light scattering particles) that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles).

Selection of the size and size distribution of the scatterers is readily determinable by those of ordinary skill in the art. The size and size distribution can be based upon the refractive index mismatch of the scattering particle and the host material in which the light scatterers are to be dispersed, and the preselected wavelength(s) to be scattered according to Rayleigh scattering theory. The surface of the scattering particle may further be treated to improve dispersability and stability in the host material. In one embodiment, the scattering particle comprises $TiO_2$ (R902+ from DuPont) of 0.2 µm particle size, in a concentration in a range from about 0.01 to about 1% by weight.

The amount of scatterers in a formulation is useful in applications where the formulation which can be an ink is contained in a clear vessel having edges to limit losses due to the total internal reflection. The amount of the scatterers may be altered relative to the amount of quantum dots used in the formulation. For example, when the amount of the scatter is increased, the amount of quantum dots may be decreased.

Examples of thixotropes which may be included in a quantum dot formulation, also referred to as rheology modifiers, include, but are not limited to, fumed metal oxides (e.g., fumed silica which can be surface treated or untreated (such as Cab-O-Sil™ fumed silica products available from Cabot Corporation)) or fumed metal oxide gels (e.g., a silica gel). An optical material can include an amount of thixotrope in a range from about 5 to about 12 weight percent. Other amounts outside the range may also be determined to be useful or desirable.

In certain embodiments, a formulation including quantum dots and a host material can be formed from an ink comprising quantum dots and a liquid vehicle, wherein the liquid vehicle comprises a composition including one or more functional groups or units that are capable of being cross-linked. The functional units can be cross-linked, for example, by UV treatment, thermal treatment, or another cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle.

One particular example of a preferred method of making an ink is as follows. A solution including quantum dots having the desired emission characteristics well dispersed in an organic solvent is concentrated to the consistency of a wax by first stripping off the solvent under nitrogen/vacuum until a quantum dot containing residue with the desired consistency is obtained. The desired resin monomer is then added under nitrogen conditions, until the desired monomer to quantum dot ratio is achieved. This mixture is then vortex mixed under oxygen free conditions until the quantum dots are well dispersed. The final components of the resin are then added to the quantum dot dispersion, and are then sonicated mixed to ensure a fine dispersion.

A tube or capillary comprising an optical material prepared from such finished ink can be prepared by then introducing the ink into the tube via a wide variety of methods, and then UV cured under intense illumination for some number of seconds for a complete cure.

In certain aspects and embodiments of the inventions taught herein, the optic including the cured quantum dot containing ink is exposed to light flux for a period of time sufficient to increase the photoluminescent efficiency of the optical material.

In certain embodiments, the optical material is exposed to light and heat for a period of time sufficient to increase the photoluminescent efficiency of the optical material.

In preferred certain embodiments, the exposure to light or light and heat is continued for a period of time until the photoluminescent efficiency reaches a substantially constant value.

In one embodiment, for example, after the optic, i.e. tube or capillary, is filled with quantum dot containing ink, cured, and sealed (regardless of the order in which the curing and sealing steps are conducted), the optic is exposed, to 25-35 $mW/cm^2$ light flux with a wavelength in a range from about 365 nm to about 470 nm, while at a temperature in a range from about 25 to 80° C., for a period of time sufficient to increase the photoluminescent efficiency of the ink. In one embodiment, for example, the light has a wavelength of about 450 nm, the light flux is 30 $mW/cm^2$, the temperature is 80° C., and the exposure time is 3 hours.

In general, quantum dots according to the present invention can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 nm to about 20 nm or about 1 nm to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added drop wise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

According to one aspect of the present invention, a polymerizable composition including quantum dots is provided. Quantum dots may be present in the polymerizable composition in an amount from about 0.05% w/w to about 5.0% w/w. According to one aspect, the polymerizable composition is photopolymerizable. The polymerizable composition is in the form of a fluid which can be placed within a tube and then one or both ends sealed with the tube being hermetically sealed to avoid oxygen being within the tube. The polymerizable composition is then subjected to light of sufficient intensity and for a period of time sufficient to polymerize the polymerizable composition, and in one aspect, in the absence of oxygen. The period of time can range between about 10 seconds to about 6 minutes or between about 1 minute to about 6 minutes. According to one embodiment, the period of time is sufficiently short to avoid agglomeration of the quantum dots prior to formation of a polymerized matrix. Agglomeration can result in FRET and subsequent loss of photoluminescent performance.

The polymerizable composition includes quantum dots in combination with one or more of a polymerizable compound. According to one aspect, the polymerizable compound avoids, resists or inhibits yellowing when in the form of a matrix, such as a polymerized matrix. A matrix in which quantum dots are dispersed may be referred to as a host material. Host materials include polymeric and non-polymeric materials that are at least partially transparent, and preferably fully transparent, to preselected wavelengths of light.

According to an additional aspect, a polymerizable host material is selected so as to provide sufficient ductility to the polymerized matrix. Ductility can be advantageous in relieving stress on thin walled glass tubes that can occur during polymer shrinkage when the polymer matrix is cured. Suitable polymerizable materials can act as solvents for the quantum dots and so combinations of polymerizable host materials can be selected based on solvent properties for various quantum dots.

Polymerizable host materials include monomers and oligomers and polymers and mixtures thereof. Exemplary monomers include lauryl methacrylate, norbornyl methacrylate, ebercyl 150 (Cytec), CD590 (Cytec) and the like. Polymerizable materials can be present in the polymerizable formulation in an amount greater than 50 weight percent. Examples include amounts in a range greater than 50 to about 99.5 weight percent, greater than 50 to about 98 weight percent, greater than 50 to about 95 weight percent, from about 80 to about 99.5 weight percent, from about 90 to about 99.95 weight percent, from about 95 to about 99.95 weight percent. Other amounts outside these examples may also be determined to be useful or desirable.

Exemplary polymerizable compositions further include one or more of a crosslinking agent, a scattering agent, a rheology modifier, a filler, and a photoinitiator.

Suitable crosslinking agents include ethylene glycol dimethacrylate ebercyl 150 and the like. Crosslinking agents can be present in the polymerizable formulation in an amount between about 0.5 wt % and about 3.0 wt %. Crosslinking agents are generally added, for example in an amount of 1% w/w, to improve stability and strength of a polymer matrix which helps avoid cracking of the matrix due to shrinkage upon curing of the matrix.

Suitable scattering agents include $TiO_2$, alumina, barium sulfate, PTFE, barium titantate and the like. Scattering agents can be present in the polymerizable formulation in an amount between about 0.05 wt % and about 1.0 wt %. Scattering agents are generally added, for example in a preferred amount of about 0.15% w/w, to promote outcoupling of emitted light.

Suitable rheology modifiers (thixotropes) include fumed silica commercially available from Cabot Corporation such as TS-720 treated fumed silica, treated silica commercially available from Cabot Corporation such as TS720, TS500, TS530, TS610 and hydrophilic silica such as M5 and EHS commercially available from Cabot Corporation. Rheology modifiers can be present in the polymerizable formulation in an amount between about 5% w/w to about 12% w/w. Rheology modifiers or thixotropes act to lower the shrinkage of the matrix resin and help prevent cracking. Hydrophobic rheology modifiers disperse more easily and build viscosity at higher loadings allowing for more filler content and less shrinkage to the point where the formulation becomes too viscous to fill the tube. Rheology modifiers such as fumed silica also provide higher EQE and help to prevent settling of $TiO_2$ on the surface of the tube before polymerization has taken place.

Suitable fillers include silica, fumed silica, precipitated silica, glass beads, PMMA beads and the like. Fillers can be present in the polymerizable formulation in an amount between about 0.01% and about 60%, about 0.01% and about 50%, about 0.01% and about 40%, about 0.01% and about 30%, about 0.01% and about 20% and any value or range in between whether overlapping or not.

Suitable photoinitiators include Irgacure 2022, KTO-46 (Lambert), Esacure 1 (Lambert) and the like. Photoinitiators can be present in the polymerizable formulation in an amount between about 1% w/w to about 5% w/w. Photoinitiators generally help to sensitize the polymerizable composition to UV light for photopolymerization.

Additional information that may be useful in connection with the present invention and the inventions described herein is included in International Application No. PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled "Solid State Lighting Devices Including Quantum Confined Semiconductor Nanoparticles, An Optical Component For A Solid State Light Device, And Methods"; International Application No. PCT/US2010/32859 of Modi et al, filed 28 Apr. 2010 entitled "Optical Materials, Optical Components, And Methods"; International Application No. PCT/US2010/032799 of Modi et al, filed 28 Apr. 2010 entitled "Optical Materials, Optical Components, Devices, And Methods"; International Application No. PCT/US2011/047284 of Sadasivan et al, filed 10 Aug. 2011 entitled "Quantum Dot Based Lighting"; International Application No. PCT/US2008/007901 of Linton et al, filed 25 Jun. 2008 entitled "Compositions And Methods Including Depositing Nanomaterial"; U.S. patent application Ser. No. 12/283,609 of Coe-Sullivan et al, filed 12 Sep. 2008 entitled "Compositions, Optical Component, System Including An Optical Component, Devices, And Other Products";

International Application No. PCT/US2008/10651 of Breen et al, filed 12 Sep. 2008 entitled "Functionalized Nanoparticles And Method"; International Application No. PCT/US2009/004345 of Breen et al, filed 28 Jul. 2009 entitled "Nanoparticle Including Multi-Functional Ligand And Method", U.S. Patent Application No. 61/234,179 of Linton et al. filed 14 Aug. 2009 entitled "Lighting Devices, An Optical Component For A Lighting Device, And Methods"; U.S. Patent Application No. 61/252,743 of Linton et al filed 19 Oct. 2009 entitled "An Optical Component, Products Including Same, And Methods For Making Same"; U.S. Patent Application No. 61/291,072 of Linton et al filed 30 Dec. 2009 entitled "An Optical Component, Products Including Same, And Methods For Making Same"; and International Application No. PCT/US2007/024320 of Clough et al, filed 21 Nov. 2007, entitled "Nanocrystals Including A Group IIIa Element And A Group Va Element, Method, Composition, Device And Other Products"; each of the foregoing being hereby incorporated herein by reference in its entirety.

Example I

Synthesis of Surface Phosphonic Acid Free CdSe Cores with 565 nm Absorbance

Quantum dots having a first absorbance peak of 565 nm were prepared using a traditional one step nucleation process, followed by a growth process as follows. Seed CdSe cores with a first absorbance peak at 480 nm (8.3 mmol Cd) are dissolved into 320 mL of 1-octadecene and degassed at 100 C for 1 hour. The temperature is increased to 240° C., upon which a 0.5M solution of Cd(Oleate) in trioctylphosphine, and a 0.5M solution of diisobutylphosphine selenide in trioctylphosphine are infused simultaneously at a rate of 40 mL/hour for approximately 1 hour. The reaction vessel is sampled intermittently to measure the red-shift of the first absorbance peak, and infusion of precursor is terminated when the desired first absorbance peak is reached. The reaction vessel is air-cooled to room temperature. The cores as grown can be stored and used in subsequent overcoating reactions without further purification.

Example II

Synthesis of CdSe/ZnS/CdZnS Core(Shell) Nanocrystals Using Surface Phosphonic Acid Free Cores CdSe cores with 565 nm first absorbance peak as synthesized above in Example I (16.0 mmol Cd, 177 mL in ODE) are added to a 1 L reaction vessel with ODE (137 mL) and Zn(Oleate) (0.5M, 53.8 mL). The reaction vessel is held under vacuum (<200 mTorr), as the temperature is raised to 100° C. and held for 15 min. The vessel is refilled with nitrogen, and the temperature set to 310° C. The temperature ramp rate is approximately 1° C. per 12 seconds. Once the temperature reaches 300° C., octanethiol is rapidly injected (23.3 mL). After 2 minutes, a mixture of Zn(Oleate)$_2$ (0.5M, 104.2 mL), Cd(Oleate)$_2$ (1.0M, 85.0 mL) and octanethiol (87.6 mL) is injected over about 30 seconds. The reaction is allowed to proceed for 30 min at 310° C., after which the reaction vessel is cooled to room temperature and precipitated via addition of BuOH (400 mL) and MeOH (200 mL). The solution is centrifuged under inert atmosphere at 4000 RCF for 3.5 minutes, and the supernatant discarded. The pellet is dissolved in about 150 mL of hexanes, and precipitated once more via the addition of 150 mL BuOH and 50 mL MeOH. The solution is centrifuged once more, the supernatant discarded, and the pellet is dissolved into Toluene (200 mL) for storage.

Example III

Preparation of Semiconductor Nanocrystals Capable of Emitting Green Light with Oleic Acid Synthesis of CdSe Cores:

262.5 mmol of cadmium acetate was dissolved in 3.826 mol of tri-n-octylphosphine at 100° C. in a 3 L 3-neck round-bottom flask and then dried and degassed for one hour. 4.655 mol of trioctylphosphine oxide and 599.16 mmol of octadecylphosphonic acid were added to a 5 L stainless steel reactor and dried and degassed at 140° C. for one hour. After degassing, the Cd solution was added to the reactor containing the oxide/acid and the mixture was heated to 310° C. under nitrogen. Once the temperature reached 310° C., the heating mantle is removed from the reactor and 731 mL of 1.5 M diisobutylphosphine selenide (DIBP-Se) (900.2 mmol Se) in 1-Dodecyl-2-pyrrolidinone (NDP) was then rapidly injected. The reactor is then immediately submerged in partially frozen (via liquid nitrogen) squalane bath rapidly reducing the temperature of the reaction to below 100° C. The first absorption peak of the nanocrystals was 480 nm. The CdSe cores were precipitated out of the growth solution inside a nitrogen atmosphere glovebox by adding a 3:1 mixture of methanol and isopropanol. After removal of the methanol/isopropanol mixture, the isolated cores were then dissolved in hexane and used to make core-shell materials. The isolated material specifications were as follows: Optical Density @350 nm=1.62; Abs=486 nm; Emission=509 nm; FWHM=38 nm; Total Volume=1.82 L of hexane.

Synthesis of CdSe/ZnS/CdZnS Core-Shell Nanocrystals:

335 mL of ODE, 68.4 mmol of zinc acetate, and 38 mL of oleic acid were loaded into a 1 L glass reactor and degassed at 100° C. for 1 hour. In a 1 L 3-neck flask, 100 mL of ODE was degassed at 120° C. for 1 hour. After degass, the temperature of the flask is reduced to 65° C. and then 23.08 mmol of CdSe cores from the procedure above (275 mL) was blended into the 100 mL of degassed octadecene (ODE) and the hexane was removed under reduced pressure. The temperature of the reactor was then raised to 310° C. In a glove box, the core/ODE solution and 40 mL of Octanethiol were added to a 180 or 360 mL container. In a 600 mL container, 151 mL of 0.5 M Zn Oleate in TOP, 37 mL of 1.0 M Cd Oleate in TOP, and 97 mL of 2 M TOP-S were added. Once the temperature of the reactor hit 310° C., the ODE/QD cores/Octanethiol mixture was injected into the reactor and allowed to react for 30 min at 300° C. After this reaction period, the Zn Oleate/Cd Oleate/TOP-S mixture was injected to the reactor and the reaction was allowed to continue for an additional 30 minutes at which point the mixture was cooled to room temperature. The resulting core-shell material was precipitated out of the growth solution inside a nitrogen atmosphere glovebox by adding a 2:1 mixture of butanol and methanol. The isolated QDs were then dissolved in toluene and precipitated a second time using 2:3 butanol:methanol. The QDs are finally dispersed in toluene. The isolated material specifications were as follows: Optical Density @450 nm=0.316; Abs=501 nm; Emission=518 nm; FWHM=38 nm; Solution QY=60; Film EQE=93%

"Solid state external quantum efficiency" (also referred to herein as "EQE" or "solid state photoluminescent efficiency) can be measured in a 12" integrating sphere using a NIST traceable calibrated light source, using the method developed by Mello et al., *Advanced Materials* 9 (3):230 (1997), which is hereby incorporated by reference. Such measurements can also be made with a QEMS from LabSphere (which utilizes a 4 in sphere; e.g. QEMS-2000: World wide website laser2000.nl/upload/documenten/fop_21-en2.pdf).

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method of making quantum dots having a coating thereon comprising:

providing a reaction mixture including core quantum dots free of phosphonic acid or metal phosphonate species at the surfaces of the core quantum dots, one or more metal carboxylates and one or more chalcogenide sources at a temperature of greater than 240° C. to form a first coating on the core quantum dots from the metal carboxylate and chalcogenide source without addition of phosphine based compounds to form first coated quantum dots, wherein the metal and chalcogenide of the first coating are the same or different from elements included in the core; and combining one or more metal precursors and one or more chalcogen precursors with the first coated quantum dots at a temperature of greater than 280° C. to form a second coating on the first coated quantum dots from the one or more metals and one or more chalcogens included in the precursors, wherein the one or more metals and one or more chalcogens included in the second coating comprises a composition that is different from the composition of at least one of the core or the first coating.

2. The method of claim 1 wherein the one or more metal precursors for the second coating comprise one or more metal carboxylates.

3. The method of claim 1 wherein the core quantum dots include group II-VI elements.

4. The method of claim 1 wherein the first coating includes group II-VI elements.

5. The method of claim 1 wherein the second coating includes group II-VI elements.

6. The method of claim 1 wherein the second coating is $Cd_xZn_{1-x}S$.

7. The method of claim 1 wherein the core quantum dots are CdSe quantum dots.

8. The method of claim 1 wherein the metal carboxylate and the chalcogenide source react immediately with each other at the reaction temperature to form nuclei of a predetermined semiconductor material.

9. The method of claim 1, further comprising preparing core quantum dots having phosphonic acid or metal phosphonate species bound thereto as ligands; and removing the bound phosphonic acid or bound metal phosphonate species from the core quantum dots to provide core quantum dots free of phosphonic acid or metal phosphonate species at the surfaces of the core quantum dots.

* * * * *